United States Patent [19]
Shichinohe et al.

[11] Patent Number: 5,373,199
[45] Date of Patent: Dec. 13, 1994

[54] MOS TRANSISTOR OUTPUT CIRCUIT

[75] Inventors: Daisuke Shichinohe; Kenji Nakao, both of Itami, Japan

[73] Assignee: Mitsubishi Denki Kabushiki Kaisha, Tokyo, Japan

[21] Appl. No.: 992,009

[22] Filed: Dec. 17, 1992

[30] Foreign Application Priority Data

Mar. 13, 1992 [JP] Japan .................... 4-054525

[51] Int. Cl.⁵ .............. H03K 17/60; H03K 17/74
[52] U.S. Cl. ........................ 327/328; 327/309; 327/436; 327/419; 326/121
[58] Field of Search ................. 307/451-452, 307/549, 550, 559, 571, 567, 248

[56] References Cited

U.S. PATENT DOCUMENTS

| 4,580,063 | 4/1986 | Torelli et al. | 307/559 |
| 4,678,950 | 7/1987 | Mitake | 307/550 |
| 4,833,348 | 5/1989 | Hannai | 307/550 |
| 5,138,194 | 8/1992 | Yoeli | 307/452 |

FOREIGN PATENT DOCUMENTS 239622 2/1990 Japan.

Primary Examiner—Margaret Rose Wambach
Attorney, Agent, or Firm—Oblon, Spivak, McClelland, Maier, & Neustadt

[57] ABSTRACT

A transistor (2P) permitted to select whether to operate as a common-source circuit or as a source follower type circuit is connected in series with a transistor (1P) operating as a common-source circuit. This selection is achieved by the control of a switching circuit (SP). Selection is permitted to be made whether to oscillate the amplitude of an output potential over the full range or to limit the amplitude by the amount of a threshold level of the transistor. An MOS transistor output circuit is provided which limits or unlimits the amplitude of the output potential for reducing undesired radiation, malfunctions due to noises and heat generated and for high-speed operation of logic circuits. (FIG. 1)

24 Claims, 11 Drawing Sheets

MOS TRANSISTOR OUTPUT CIRCUIT

BACKGROUND OF THE INVENTION

1. Field of the Invention

The present invention relates to techniques for limiting the level of an output potential at an MOS transistor output circuit.

2. Description of the Background Art

In general, output circuits of MOS transistor output circuits have been complementary MOS output circuits as shown in FIG. 13. In the conventional complementary MOS output circuit, a P-channel transistor 1P and an N-channel transistor 1N which are common-source circuits are connected in series. An input terminal Tin is connected to the gates of the transistors 1P and 1N in common, and an output terminal Tout is connected to the drains thereof in common. An input signal is applied to the input terminal Tin, so that an inverted signal of the input signal is outputted as an output signal to the output terminal Tout.

In the conventional MOS transistor output circuit thus constructed, the level of the output signal thereof oscillates from a ground potential GND to a power supply potential $V_{DD}$ by the transition (change in logical state) of the input signal unless a load current is a direct current.

A large amplitude of the output signal causes various problems under certain circumstances. One of the problems is known as undesired radiation which is to jam other electronic equipments. Another problem is the malfunctions of logic circuits due to noises generated when a logical state changes. It is preferable in some cases that the output signal has a small amplitude in terms of delay times of the logic circuits, heat generation in integrated circuits and other characteristics.

SUMMARY OF THE INVENTION

According to the present invention, an MOS transistor output circuit comprises: an input terminal receiving an input signal; an output terminal; first and second potential points; first switching means having a first terminal connected to the second potential point, a second terminal, and a common terminal; a first MOS transistor of a first conductivity type having a control electrode connected to the input terminal, and first and second current electrodes; and a second MOS transistor of the first conductivity type having a control electrode connected to the common terminal of the first switching means, a first current electrode, and a second current electrode connected to the second terminal of the first switching means, the first and second MOS transistors being connected in series between the first potential point and the output terminal.

The second MOS transistor is connected in series with the first MOS transistor operating as a common-source circuit and may select whether to operate as a common-source circuit or a source follower type circuit. The output potential is not limited when the second MOS transistor operates as the common-source circuit. The output potential is limited when the second MOS transistor operates as the source follower type circuit.

In another aspect of the present invention, an MOS transistor output circuit comprises: an input terminal; an output terminal; a first potential point; a first MOS transistor of a first conductivity type having a control electrode connected to the input terminal, and first and second current electrodes; a second MOS transistor of the first conductivity type having a control electrode, a first current electrode, and a second current electrode connected to the control electrode thereof; and a first switch connected between the first and second current electrodes of the second MOS transistor, the first and second MOS transistors being connected in series between the first potential point and the output terminal.

The second MOS transistor is connected in series with the first MOS transistor operating as the common-source circuit and operates as the source follower type circuit. The output potential is not limited when the switch connected in parallel with the second MOS transistor is closed. The output potential is limited when the switch is opened.

In still another aspect of the present invention, an MOS transistor output circuit comprises: an input terminal receiving an input signal; an output terminal; a first potential point; a first MOS transistor of a first conductivity type having a first current electrode connected to the first potential point, a second current electrode connected to the output terminal, and a control electrode connected to the input terminal; a second MOS transistor of a second conductivity type having a first current electrode connected to the output terminal, a second current electrode connected to the first potential point, and a control electrode receiving a logically inverted signal of the input signal; and first control means determining whether to permit the first MOS transistor to conduct or not.

The first MOS transistor is connected in parallel with the second MOS transistor operating as the source follower type circuit and may select whether to operate as the common-source circuit or to be off. The output potential is not limited when the first MOS transistor operates as the common-source circuit. The output potential is limited by the second MOS transistor when the first MOS transistor is off.

According to the present invention, it is allowed to select the combinations of the operations of the transistors as the common-source circuit and source follower type circuit, to afford the selection whether to limit the amplitude of the output potential of the output circuit. Achieved are reduction in undesired radiation, malfunctions due to noises and heat generated as well as high-speed operation of the logic circuits, when the amplitude of the output potential is limited.

An object of the present invention is to provide an MOS transistor output circuit which limits or unlimits the potential amplitude of an output signal thereof as required.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
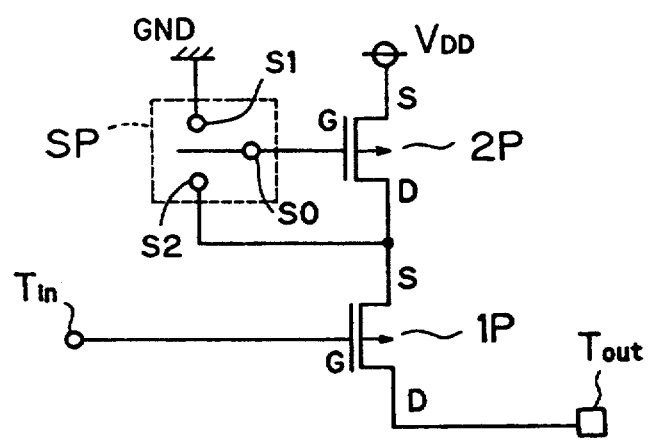
FIGS. 1, 2 and 5 are circuit diagrams of a first preferred embodiment according to the present invention.

FIG. 1 is a circuit diagram of a first preferred embodiment according to the present invention. The first preferred embodiment is an "H" level output circuit in which the gate of a P-channel transistor 1P is connected to an input terminal Tin and the drain thereof is connected to an output terminal Tout. The drain of a P-channel transistor 2P is connected to the source of the transistor 1P and the source thereof is connected to a power supply potential $V_{DD}$.

The gate of the transistor 2P is connected to a common terminal S0 of a switching circuit SP. A first terminal S1 of the switching circuit SP is grounded (connected to a potential GND), and the drain of the transistor 2P is connected to a second terminal S2 of the switching circuit SP. The switching circuit SP is achieved in a partial process step for fabricating an integrated circuit, for example in a metal wiring step, which will be described later.

When the common terminal S0 of the switching circuit SP is connected to the first terminal S1 and the gate of the transistor 2P is connected to the GND potential, the transistor 2P operates as a common-source circuit and is constantly on. At this time, when the "L" level is inputted to the input terminal Tin to turn on the transistor 1P, the power supply potential $V_{DD}$ at the "H" level is outputted to the output terminal Tout.

When the common terminal S0 of the switching circuit SP is connected to the second terminal S2 and the gate of the transistor 2P is connected to the drain thereof, the transistor 2P operates as a source follower type circuit. An "H" level which is lower by a threshold voltage $V_{th}$ of the transistor 2P than the power supply potential $V_{DD}$ is outputted to the output terminal Tout. Thus the amplitude of the output potential at the "H" level is limited.

Figure 2:
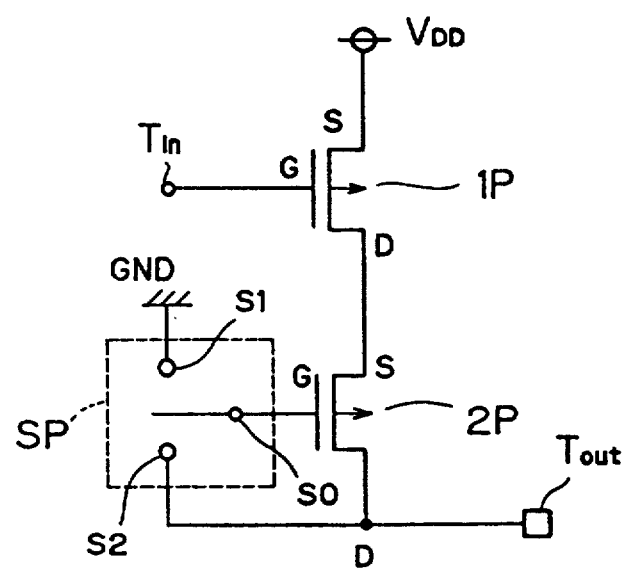

The amount of drop of the output potential is about 1.0 to 1.7 V in a general enhancement complementary MOS process. The effect of the present invention is obtained inasmuch as the transistors 1P and 2P are connected in series. The position may be interchanged between the transistors 1P and 2P. Specifically, the output circuit may be constructed as shown in FIG. 2 in which the gate and source of the P-channel transistor 1P are connected respectively to the input terminal Tin and the power supply potential $V_{DD}$ and the drain and source of the P-channel transistor 2P are connected respectively to the output terminal Tout and the drain of the transistor 1P. Also in the circuit of FIG. 2, the switching circuit SP includes the common terminal S0 connected to the gate of the transistor 2P, the first terminal S1 grounded (connected to the potential GND), and the second terminal S2 connected to the drain of the transistor 2P.

Figure 3:
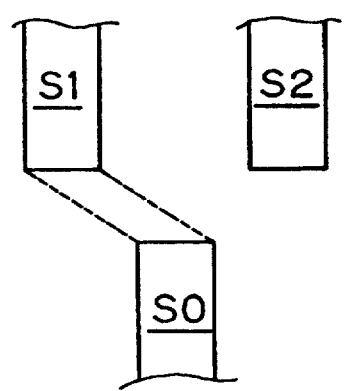
FIGS. 3 and 4 are plan views of exemplary arrangements of a switching circuit.
Figure 4:
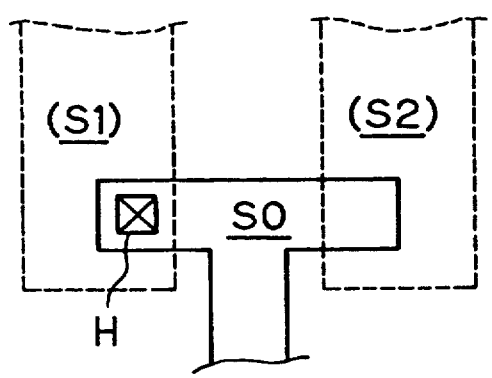

FIGS. 3 and 4 show exemplary arrangements of the switching circuit SP. Referring to FIG. 3, the first terminal S1, second terminal S2 and common terminal S0 are formed by wiring of metal mainly containing aluminum. Whether the common terminal S0 is to be connected to the first terminal S1 or to the second terminal S2 is selected in the partial process step for fabricating the integrated circuit and is determined by wiring. The broken lines of FIG. 3 indicate the connection of the common terminal S0 to the first terminal S1.

With reference to FIG. 4, the first terminal S1, second terminal S2 and common terminal S0 are formed by wiring of metal mainly containing aluminum. The wiring layer including the common terminal S0 is different from the wiring layer including the first and second terminals S1 and S2. Whether the common terminal S0 is to be connected to the first terminal S1 or to the second terminal S2 is selected in the partial process step for fabricating the integrated circuit similarly to the FIG. 3 case but is determined by the formation of a through hole. In FIG. 4, the common terminal S0 is shown as connected to the first terminal S1 with a through hole H.

Figure 5:
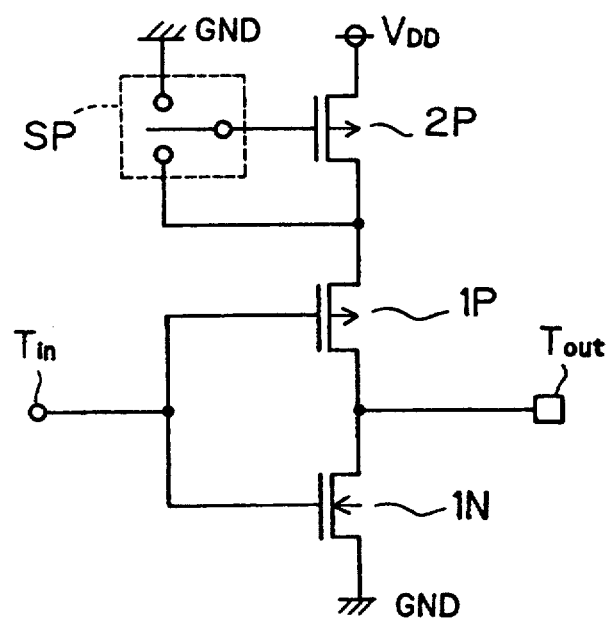

FIG. 5 is a circuit diagram of a complementary MOS transistor output circuit to which the first preferred embodiment is applied. The complementary MOS transistor output circuit of FIG. 5 having a common construction comprises the "H" level output circuit of the first preferred embodiment and an "L" level output circuit including a single N-channel transistor 1N. The output circuit of FIG. 5 does not limit the amplitude at the "L" level, but selects the limit of the amplitude at the "H" level to output the "H" level.

Although the present invention is applied to the "H" level output circuit in the first preferred embodiment shown in FIG. 1, the present invention may be applied to the "L" level output circuit.

Figure 6:
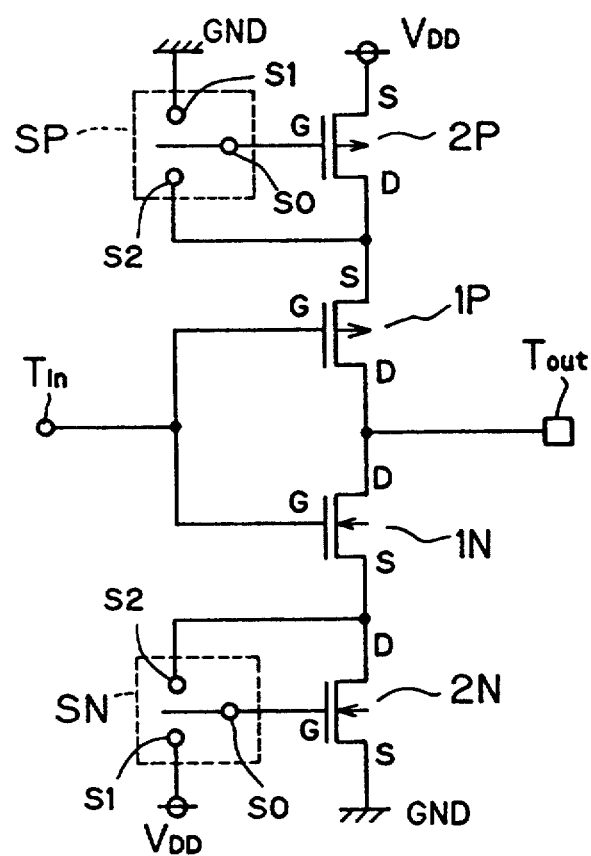
FIG. 6 is a circuit diagram of a second preferred embodiment according to the present invention.

FIG. 6 is a circuit diagram of a second preferred embodiment according to the present invention. The second preferred embodiment is a complementary MOS transistor output circuit in which the present invention is applied to both the "H" level output circuit and the "L" level output circuit. The transistors 1P, 2P and switching circuit SP of FIG. 6 form the "H" level output circuit identical with that of the first preferred embodiment shown in FIG. 1.

The "L" level output circuit is constructed in complementary relation to the "H" level output circuit. The gate and drain of the N-channel transistor 1N are connected respectively to the input terminal Tin and the output terminal Tout. The drain of an N-channel transistor 2N is connected to the source of the transistor 1N and the source thereof is grounded (connected to the potential GND).

A switching circuit SN includes a common terminal S0 connected to the gate of the transistor 2N, a first terminal S1 connected to the power supply potential $V_{DD}$, and a second terminal S2 connected to the drain of the transistor 2N. The switching circuit SN has an arrangement similar to the switching circuit SP illustrated in FIGS. 3 and 4.

The operation of the "H" level output circuit of the second preferred embodiment is similar to that of the first preferred embodiment. The operation of the "L" level output circuit will be described below.

When the common terminal S0 of the switching circuit SN is connected to the first terminal S1 and the gate of the transistor 2N is connected to the power supply potential V$_{DD}$, the transistor 2N operates as the common-source circuit and is constantly on. At this time, when the "H" level is inputted to the input terminal Tin to turn on the transistor 1N, the ground potential GND at the "L" level is outputted to the output terminal Tout.

When the common terminal S0 of the switching circuit SN is connected to the second terminal S2 and the gate of the transistor 2N is connected to the drain thereof, the transistor 2N operates as the source follower type circuit. An "L" level which is higher by the threshold voltage Vth Of the transistor 2N than the ground potential GND is outputted to the output terminal Tout.

Thus the amplitude of the output potential at both the "H" and "L" levels is limited in the second preferred embodiment.

Figure 7:
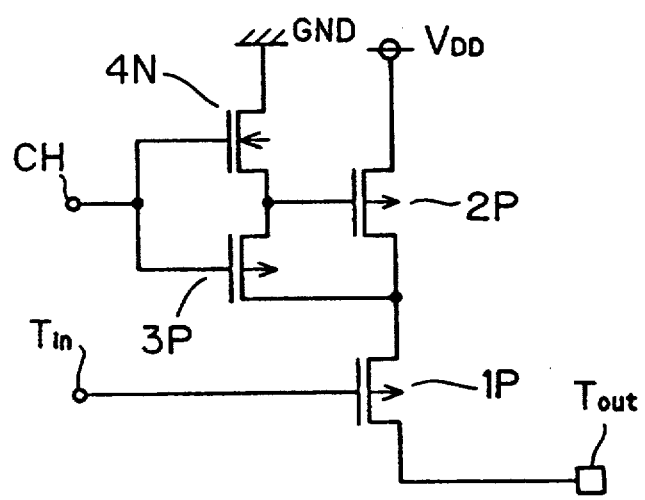
FIG. 7 is a circuit diagram of a third preferred embodiment according to the present invention.

FIG. 7 is a circuit diagram of a third preferred embodiment according to the present invention. The third preferred embodiment is an "H" level output circuit identical with that of FIG. 1 except that the switching circuit SP of FIG. 1 is replaced with a P-channel transistor 3P and an N-channel transistor 4N used as a switching element. A control terminal CH is connected to the gates of the transistors 3P and 4N in common and receives a signal for controlling whether to permit the potential amplitude at the "H" level to be limited or not.

When the control terminal CH is at the "H" level potential, the transistor 4N is on and the transistor 3P is off. The ground potential GND is applied to the gate of the transistor 2P, which then operates as the common-source circuit and is constantly on, so that the level of the output potential is not limited. This is equivalent to the operation of the first preferred embodiment when the common terminal S0 is connected to the first terminal S1.

When the control terminal CH is at the "L" level potential, the transistor 3P is on and the transistor 4N is off. The transistor 2P operates as the source follower type circuit, and the output potential at the "H" level is limited by the amount of the threshold voltage V$_{th}$ of the transistor 2P. This is equivalent to the operation of the first preferred embodiment when the common terminal S0 is connected to the second terminal S2.

Whether to permit the control terminal CH to limit the potential amplitude or not may be controlled in the partial process step for fabricating the integrated circuit by, for example, connecting power supply lines or ground lines to the control terminal CH. In the third preferred embodiment, it may be controlled from the exterior by providing the control terminal CH as an external terminal or be controlled by means of the contents of an inner register.

Figure 8:
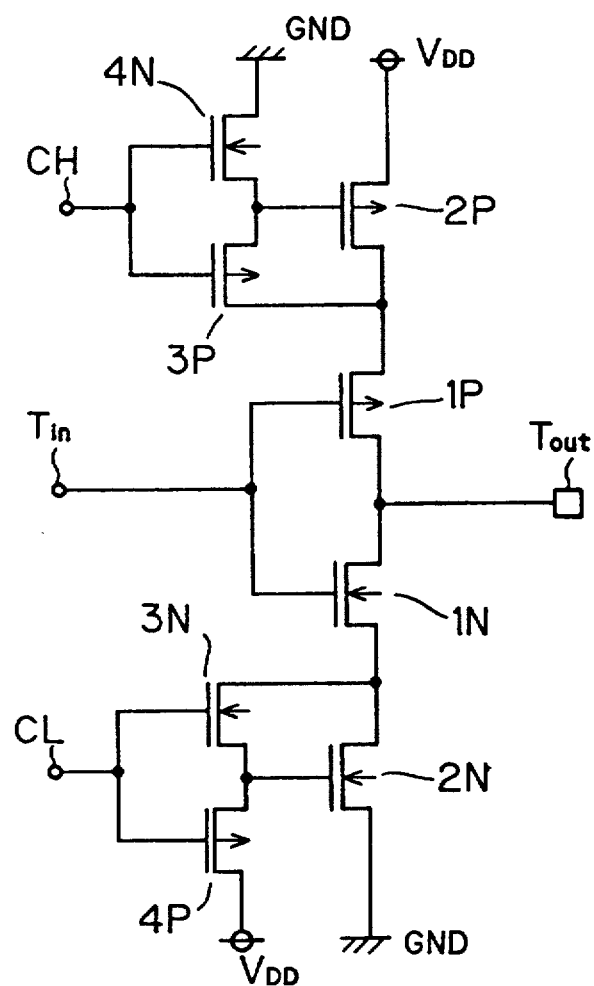
FIG. 8 is a circuit diagram of a fourth preferred embodiment according to the present invention.

FIG. 8 is a circuit diagram of a fourth preferred embodiment according to the present invention. The fourth preferred embodiment is a complementary MOS transistor output circuit in which the construction of the third preferred embodiment is applied to the "L" level output circuit. The "L" level output circuit shown in FIG. 8 is constructed in complementary relation to the "H" level output circuit shown in FIG. 7. In other words, the switching circuit SN in the "L" level output circuit of FIG. 6 is replaced with an N-channel transistor 3N and a P-channel transistor 4P used as a switching element. A control terminal CL is connected to the gates of the transistors 3N and 4P in common and receives a signal for controlling whether to permit the potential amplitude at the "L" level to be limited or not.

Similarly to the third preferred embodiment, the level of the output potential is not limited when the control terminal CL is at the "L" level potential. This is equivalent to the operation of the second preferred embodiment when the common terminal S0 is connected to the first terminal S1. When the control terminal CL is at the "H" level potential, the output potential at the "L" level is limited by the amount of the threshold voltage V$_{th}$ of the transistor 2N. This is equivalent to the operation of the second preferred embodiment when the common terminal S0 is connected to the second terminal S2.

Similarly to the third preferred embodiment, whether to permit the control terminal CL to limit the potential amplitude or not is controlled in the partial process step for fabricating the integrated circuit by connecting the power supply lines and ground lines to the control terminal CL. Otherwise, it may be controlled from the exterior by providing the control terminal CL as an external terminal or be controlled by means of the contents of the inner register.

Figure 9:
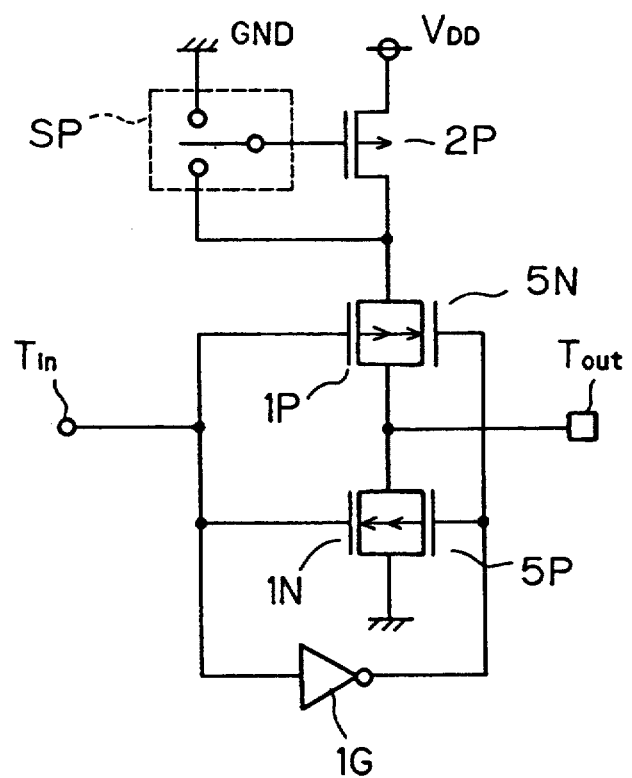
FIG. 9 is a circuit diagram of a fifth preferred embodiment according to the present invention.

FIG. 9 is a circuit diagram of a fifth preferred embodiment according to the present invention. In the fifth preferred embodiment, the present invention is applied to the "H" level output circuit of the complementary MOS transistor output circuit including transfer gates.

The "H" level output circuit includes an N-channel transistor 5N and the P-channel transistor 1P which are connected in parallel. The transistors 5N and 1P form a transfer gate. The "L" level output circuit includes a P-channel transistor 5P and the N-channel transistor 1N which are connected in parallel. The transistors 5P and 1N form a transfer gate.

Similarly to the circuit of FIG. 5, the input terminal Tin is connected to the gates of the transistors 1P and 1N in common and the output terminal Tout is connected to the drains of the transistors 1P and 1N in common. An inverter 1G inverts the logical state of the input signal of the input terminal Tin, and the inverted signal is applied to the gates of the transistors 5N and 5P.

In the complementary MOS transistor output circuit including the transfer gates, the provision of the transistor 2P and the switching circuit SP in the same manner as the circuit of FIG. 5 permits the selection whether to control the amplitude of the output potential at the "H" level or not.

Figure 10:
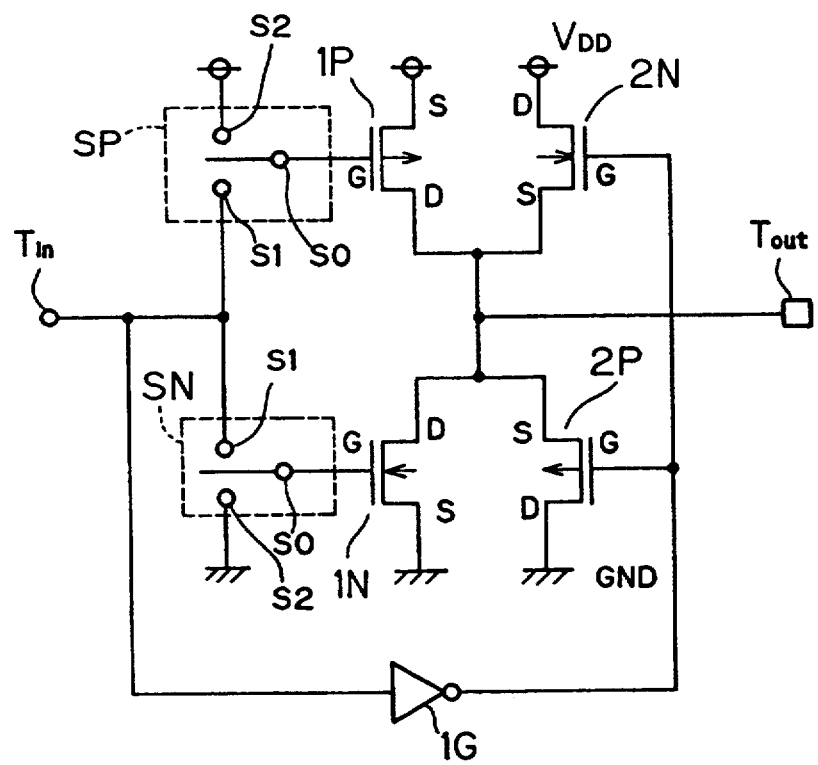
FIG. 10 is a circuit diagram of a sixth preferred embodiment according to the present invention.

FIG. 10 is a circuit diagram of a sixth preferred embodiment according to the present invention. The sixth preferred embodiment is a complementary MOS transistor output circuit in which the present invention is applied to both the "H" level output circuit and "L" level output circuit.

The "H" level output circuit will be discussed below. The P-channel transistor 1P has the gate connected to the common terminal S0 of the switching circuit SP, the source connected to the power supply potential V$_{DD}$, and the drain connected to the output terminal Tout. The switching circuit SP has the first terminal S1 connected to the input terminal Tin and the second terminal S2 connected to the power supply potential V$_{DD}$. The N-channel transistor 2N has the gate connected to the output end of the inverter 1G, the drain connected to the power supply potential V$_{DD}$, and the source connected to the output terminal Tout. The input terminal Tin is connected to the input end of the inverter 1G.

In such construction, the transistor 2N operates as the source follower type circuit, and the transistor 1P performs different operations depending on the connection of the switching circuit SP.

When the common terminal S0 is connected to the first terminal S1, the transistor 1P operates as the common-source circuit and forms a transfer gate together with the transistor 2N. The operation of the transistor 2N as the source follower type circuit is compensated for by the operation of the transistor 1P as the common-source circuit, so that the output potential is not limited.

When the common terminal S0 is connected to the second terminal S2, the transistor 1P is off and only the operation of the transistor 2N as the source follower type circuit determines the output potential. Thus the output potential at the "H" level is limited by the amount of the threshold voltage $V_{th}$ of the transistor 2N.

The "L" level output circuit is constructed in complementary relation to the "H" level output circuit. The N-channel transistor 1N has the gate connected to the common terminal S0 of the switching circuit SN, the source connected to the ground potential GND, and the drain connected to the output terminal Tout. The switching circuit SN has the first terminal S1 connected to the input terminal Tin, and the second terminal S2 connected to the ground potential GND. The P-channel transistor 2P has the gate connected to the output end of the inverter 1G, the drain connected to the ground potential GND, and the source connected to the output terminal Tout. In such construction, the transistor 2P operates as the source follower type circuit, and the transistor 1N performs different operations depending on the connection of the switching circuit SN.

Similarly to the "H" level output circuit, the operation of the transistor 2P as the source follower type circuit is compensated for by the operation of the transistor 1N as the common-source circuit, so that the output potential is not limited when the common terminal S0 is connected to the first terminal S1. When the common terminal S0 is connected to the second terminal S2, only the operation of the transistor 2P as the source follower type circuit determines the output potential, so that the output potential at the "L" level is limited by the amount of the threshold voltage $V_{th}$ of the transistor 2P.

The sixth preferred embodiment provides for the control whether to limit the amplitude of the output potential at the "H" level or not and the control whether to limit the amplitude thereof at the "L" level or not, similarly to the second preferred embodiment.

Figure 11:
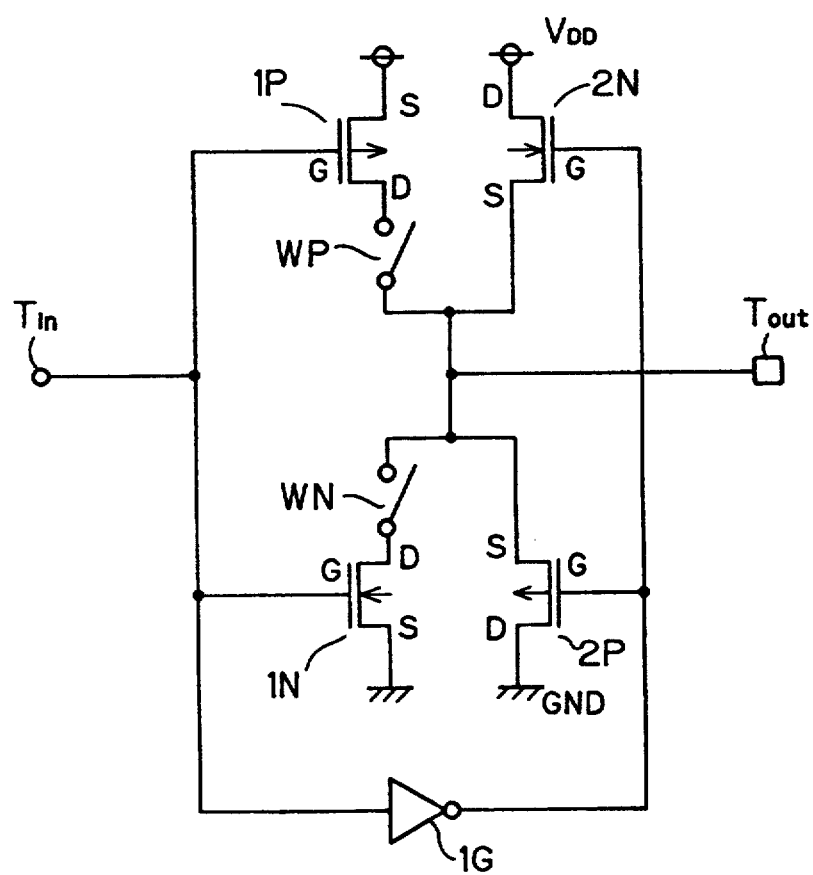
FIG. 11 is a circuit diagram of a seventh preferred embodiment according to the present invention.

FIG. 11 is a circuit diagram of a seventh preferred embodiment according to the present invention. The seventh preferred embodiment is a complementary MOS transistor output circuit in which the present invention is applied to both the "H" level output circuit and "L" level output circuit.

The transistors 2N and 2P are connected in the same manner as those of the sixth preferred embodiment and operate as the source follower type circuits. The input terminal Tin is connected to the gates of the P-channel transistor 1P and N-channel transistor 1N in common. The power supply potential $V_{DD}$ and the ground potential GND are connected to the sources of the transistors 1P and 1N, respectively. One end of a switch WP is connected to the drain of the transistor 1P, and one end of a switch WN is connected to the drain of the transistor 1N. The output terminal Tout is connected to the respective other ends of the switches WP and WN. In such construction, the transistors 1P and 1N perform different operations depending on the opening and closing of the switches WP and WN.

The operation of the "H" level output circuit will be described below. The closing of the switch WP is the operation equivalent to the connection of the common terminal S0 to the first terminal S1 in the sixth preferred embodiment. When the switch WP is closed, the operation of the transistor 2N as the source follower type circuit is compensated for by the operation of the transistor 1P as the common-source circuit, so that the output potential is not limited. The opening of the switch WP is the operation equivalent to the connection of the common terminal S0 to the second terminal S2 in the sixth preferred embodiment. When the switch WP is opened, since only the operation of the transistor 2N as the source follower type circuit determines the output potential, the output potential at the "H" level is limited by the amount of the threshold voltage $V_{th}$ of the transistor 2N.

The same is true for the operation of the "L" level output circuit. The output potential is not limited when the switch WN is closed. The output potential at the "L" level is limited by the amount of the threshold voltage $V_{th}$ of the transistor 2P when the switch WP is opened.

Thus the seventh preferred embodiment provides the same effects as the sixth preferred embodiment.

Figure 12:
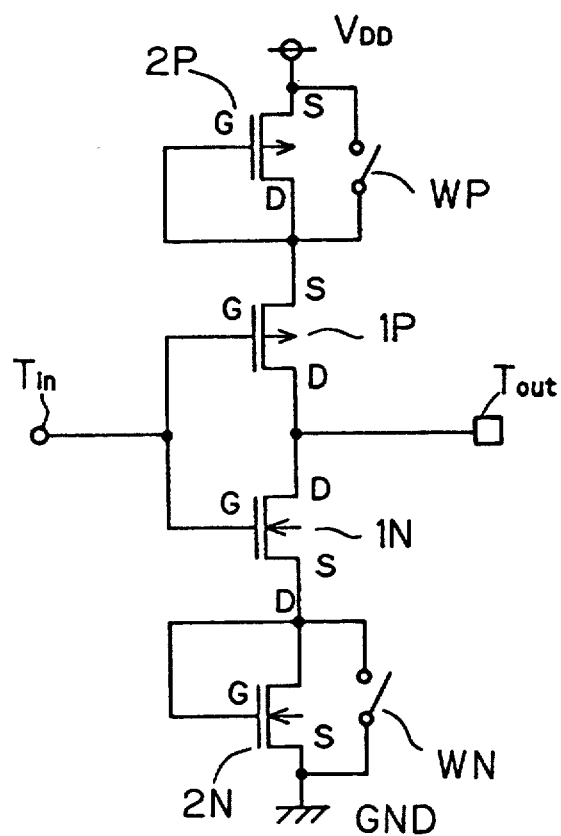
FIG. 12 is a circuit diagram of an eighth preferred embodiment according to the present invention.
Figure 13:
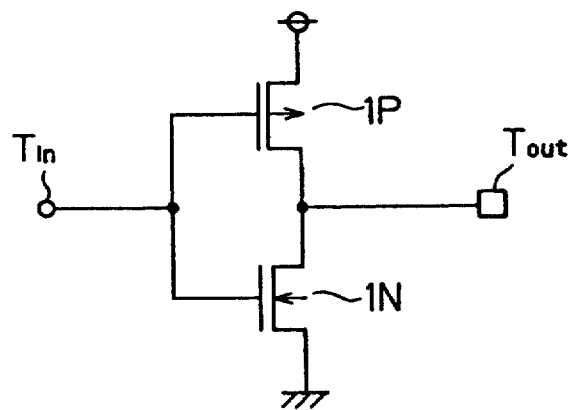
FIG. 13 is a circuit diagram of a conventional complementary MOS output circuit.

FIG. 12 is a circuit diagram of an eighth preferred embodiment according to the present invention. The circuit of FIG. 12 has the construction similar to the conventional complementary MOS transistor output circuit of FIG. 13 except that the circuit of FIG. 12 includes the P-channel transistor 1P whose source is not directly connected to the power supply potential $V_{DD}$ and the N-channel transistor 1N whose source is not directly connected to the ground potential GND.

The "H" level output circuit includes the diode connected P-channel transistor 2P and the switch WP connected in parallel with the transistor 2P which are formed between the power supply potential $V_{DD}$ and the source of the transistor 1P. The gate and drain of the transistor 2P are commonly connected to the source of the transistor 1P, and the source of the transistor 2P is connected to the power supply potential $V_{DD}$. The switch WP is provided between the power supply potential $V_{DD}$ and the source of the transistor 1P.

The "L" level output circuit includes the diode connected N-channel transistor 2N and the switch WN connected in parallel with the transistor 2N which are formed between the ground potential GND and the source of the transistor 1N. The gate and drain of the transistor 2N are commonly connected to the source of the transistor 1N, and the source of the transistor 2N is connected to the ground potential GND. The switch WN is provided between the ground potential GND and the source of the transistor 1N.

The operation of the "H" level output circuit will be described below. When the switch WP is closed, the source of the transistor 1P is connected to the power supply potential $V_{DD}$, so that the output potential is not limited similarly to the circuit of FIG. 13. When the switch WP is opened, the source of the transistor 1P is connected to the drain and gate of the transistor 2P, which then operates as the source follower type circuit, so that the output potential at the "H" level is limited by the amount of the threshold voltage $V_{th}$ of the transistor 2P.

The same is true for the operation of the "L" level output circuit. When the switch WN is closed, the output potential is not limited. When the switch WN is opened, the output potential at the "L" level is limited by the amount of the threshold voltage $V_{th}$ of the transistor 2N.

The eighth preferred embodiment provides the same effects as the seventh preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A MOS transistor output circuit, comprising:
   an input terminal receiving an input signal;
   an output terminal;
   first and second potential points;
   first switching means having a first terminal connected to said second potential point, a second terminal, and a common terminal;
   a first MOS transistor of a first conductivity type having a control electrode connected to said input terminal, and first and second current electrodes; and
   a second MOS transistor of the first conductivity type having a control electrode connected to said common terminal of said first switching means, a first current electrode, and a second current electrode connected to said second terminal of said first switching means,
   said first and second MOS transistors being connected in series between said first potential point and said output terminal.

2. The MOS transistor output circuit of claim 1, wherein said first current electrode of the first MOS transistor is connected to said second current electrode of said second MOS transistor, and said second current electrode of said first MOS transistor is connected to said output terminal, and said first current electrode of said second MOS transistor is connected to said first potential point.

3. The MOS transistor output circuit of claim 1, wherein said first current electrode of said first MOS transistor is connected to said first potential point, and said second current electrode of said first MOS transistor is connected to said first current electrode of said second MOS transistor, and said second current electrode of said second MOS transistor is connected to said output terminal.

4. The MOS transistor output circuit of claim 1, wherein said first switching means includes a plurality of wires made of aluminum alloy.

5. The MOS transistor output circuit of claim 4, wherein
   said wires include
   a first wire corresponding to said common terminal of said first switching means, and
   second and third wires corresponding to said first and second terminals of said first switching means, respectively, and formed in a layer different from a layer in which said first wire is formed, and
   said first switching means further includes
   a through hole for connecting one of said second and third wires to said first wire.

6. The MOS transistor output circuit of claim 1, further comprising:
   a third MOS transistor of a second conductivity type having a control electrode connected to said input terminal, and first and second current electrodes connected between said output terminal and said second potential point.

7. The MOS transistor output circuit of claim 6, wherein said first current electrode of said third MOS transistor is connected to said second potential point, and said second current electrode of said third MOS transistor is connected to said output terminal.

8. The MOS transistor output circuit of claim 6, further comprising:
   second switching means having a first terminal connected to said first potential point, a second terminal, and a common terminal; and
   a fourth MOS transistor of the second conductivity type having a control electrode connected to said common terminal of said second switching means, a first current electrode, and a second current electrode connected to said second terminal of said second switching means,
   said third and fourth MOS transistors being connected in series between said second potential point and said output terminal.

9. The MOS transistor output circuit of claim 8, wherein said first current electrode of said third MOS transistor is connected to said second current electrode of said fourth MOS transistor, and said second current electrode of said third MOS transistor is connected to said output terminal, and said first current electrode of said fourth MOS transistor is connected to said second potential point.

10. The MOS transistor output circuit of claim 1, wherein
    said first switching means includes
    a control terminal receiving a switching signal determining whether to connect said common terminal of said first switching means to said first or second terminal of said first switching means,
    a third MOS transistor of a second conductivity type having a first current electrode connected to said first terminal of said first switching means, a second current electrode connected to said common terminal of said first switching means, and a control electrode connected to said control terminal, and
    a fourth MOS transistor of the first conductivity type having a first current electrode connected to said second terminal of said first switching means, a second current electrode connected to said common terminal of said first switching means, and a control electrode connected to said control terminal.

11. The MOS transistor output circuit of claim 8, wherein
    said first switching means includes
    a control terminal receiving a switching signal determining whether to connect said common terminal of said first switching means to said first or second terminal of said first switching means,
    a fifth MOS transistor of the second conductivity type having a first current electrode connected to said first terminal of said first switching means, a second current electrode connected to said common terminal of said first switching means, and a control electrode connected to said control terminal, and a sixth MOS transistor of the first conductivity type having a first current electrode connected to said second terminal of said first switching means, a second current electrode connected to said common terminal of said first switching means, and a control electrode connected to said control terminal.

12. The MOS transistor output circuit of claim 6, further comprising:
a fourth MOS transistor of the second conductivity type having first and second current electrodes connected to said second and first current electrodes of said first MOS transistor, respectively, and a control electrode; and
a fifth MOS transistor of the first conductivity type having first and second current electrodes connected to said second and first current electrodes of said third MOS transistor, respectively, and a control electrode connected to said control electrode of said fourth MOS transistor,
said control electrode of said fifth MOS transistor receiving a logically inverted signal of said input signal.

13. The MOS transistor output circuit of claim 12, further comprising:
an inverter having an input end connected to said input terminal and an output end connected to said control electrode of said fifth MOS transistor.

14. A MOS transistor output circuit, comprising:
an input terminal;
an output terminal;
a first potential point;
a first MOS transistor of a first conductivity type having a control electrode connected to said input terminal, and first and second current electrodes;
a second MOS transistor of the first conductivity type having a control electrode, a first current electrode, and a second current electrode connected to said control electrode thereof; and
a first switch connected between said first and second current electrodes of said second MOS transistor,
said first and second MOS transistors being connected in series between said first potential point and said output terminal.

15. The MOS transistor output circuit of claim 14, wherein said first current electrode of said first MOS transistor is connected to said second current electrode of said second MOS transistor, and said second current electrode of said first MOS transistor is connected to said output terminal, and said first current electrode of said second MOS transistor is connected to said first potential point.

16. The MOS transistor output circuit of claim 14, further comprising:
a second potential point;
a third MOS transistor of a second conductivity type having a control electrode connected to said input terminal, and first and second current electrodes;
a fourth MOS transistor of the second conductivity type having a control electrode, a first current electrode, and a second current electrode connected to said control electrode thereof; and
a second switch connected between said first and second current electrodes of said fourth MOS transistor,
said third and fourth MOS transistors being connected in series between said second potential point and said output terminal.

17. A MOS transistor output circuit, comprising:
an input terminal receiving an input signal;
an output terminal;
a first potential point;
a first MOS transistor of a first conductivity type having a first current electrode connected to said first potential point, a second current electrode connected to said output terminal, and a control electrode capable of being connected to said input terminal;
a second MOS transistor of a second conductivity type having a first current electrode connected to said output terminal, a second current electrode connected to said first potential point, and a control electrode receiving a logically inverted signal of said input signal; and
first control means for determining whether to permit only said first MOS transistor to conduct or not.

18. The MOS transistor output circuit of claim 17, further comprising:
an inverter having an input end connected to said input terminal, and an output end connected to said control electrode of said second MOS transistor.

19. The MOS transistor output circuit of claim 17, wherein
said control electrode of said first MOS transistor is capable of being connected to said input terminal through said first control means, and
said first control means having a common terminal connected to said control electrode of said first MOS transistor, a first terminal connected to said first potential point, and a second terminal connected to said input terminal.

20. The MOS transistor output circuit of claim 19, further comprising:
a second potential point;
a third MOS transistor of the second conductivity type having a first current electrode connected to said second potential point, a second current electrode connected to said output terminal, and a control electrode capable of being connected to said input terminal;
a fourth MOS transistor of the first conductivity type having a first current electrode connected to said output terminal, a second current electrode connected to said second potential point; and a control electrode receiving a logically inverted signal of said input signal; and
second control means connected between said control electrode of said third MOS transistor and said input terminal and having a common terminal connected to said control electrode of said third MOS transistor, a first terminal connected to said second potential point, and a second terminal connected to said input terminal.

21. A MOS transistor output circuit, comprising:
an input terminal receiving an input signal;
an output terminal;
a first potential point;
a first MOS transistor of a first conductivity type having a first current electrode connected to said first potential point, a second current electrode capable of being connected to said output terminal, and a control electrode connected to said input terminal;
a second MOS transistor of a second conductivity type having a first current electrode connected to said output terminal, a second current electrode connected to said first potential point, and a control electrode receiving a logically inverted signal of said input signal; and first control means for determining whether to permit only said first MOS transistor to conduct or not.

22. The MOS transistor output circuit of claim 21, further comprising:

an inverter having an input end connected to said input terminal, and an output end connected to said control electrode of said second MOS transistor.

23. The MOS transistor output circuit of claim 21, wherein said second current electrode of said first MOS transistor is capable of being connected to said output terminal through said first control means, and said first control means includes a first switch.

24. The MOS transistor output circuit of claim 23, further comprising:

a second potential point;

a third MOS transistor of the second conductivity type having a first current electrode connected to said second potential point, a second current electrode capable of being connected to said output terminal, and a control electrode connected to said input terminal;

a fourth MOS transistor of the first conductivity type having a first current electrode connected to said output terminal, a second current electrode connected to said second potential point, and a control electrode receiving a logically inverted signal of said input signal; and second control means connected between said second current electrode of said third MOS transistor and said output terminal and including a second switch.

* * * * *